United States Patent [19]

Thomas

[11] Patent Number: 4,782,893
[45] Date of Patent: Nov. 8, 1988

[54] ELECTRICALLY INSULATING THERMALLY CONDUCTIVE PAD FOR MOUNTING ELECTRONIC COMPONENTS

[75] Inventor: Daniel L. Thomas, Portland, Oreg.

[73] Assignee: Trique Concepts, Inc., San Jose, Calif.

[21] Appl. No.: 159,619

[22] Filed: Feb. 23, 1988

Related U.S. Application Data

[63] Continuation of Ser. No. 906,954, Sep. 15, 1986, abandoned.

[51] Int. Cl.$^4$ ................................. F28F 7/00
[52] U.S. Cl. ......................... 165/185; 174/16 HS; 361/386
[58] Field of Search ............... 165/185; 174/16 HS; 361/386, 387, 388

[56] References Cited

U.S. PATENT DOCUMENTS

| | | | |
|---|---|---|---|
| 3,678,995 | 7/1972 | Collard | 165/185 |
| 3,721,289 | 3/1973 | Seal | 165/185 X |
| 3,828,848 | 8/1974 | Custers et al. | 165/185 X |
| 4,602,125 | 7/1986 | West et al. | 174/16 HS |

FOREIGN PATENT DOCUMENTS

| | | | |
|---|---|---|---|
| 2951296 | 6/1981 | Fed. Rep. of Germany | 174/16 HS |
| 1007529 | 10/1965 | United Kingdom | 174/16 HS |

*Primary Examiner*—Michael Koczo
*Assistant Examiner*—Peggy Neils
*Attorney, Agent, or Firm*—Alan H. MacPherson; Brian D. Ogonowsky; Paul J. Winters

[57] ABSTRACT

The pad of the present invention is comprised of a thin film of high dielectric strength material which is impregnated with diamond powder. The diamond pieces are relatively uniform in size and have a minimum dimension which is greater than the thickness of the film. In one embodiment, a 5,000–10,000 angstrom boundary layer of copper is formed on both sides of the film by a vacuum deposition or electroless dipping and thicker cover layers are electroplated on top of this boundary layer, if desired, to make the pad rigid. In addition, a copper or aluminum substrate can be clad to one or both cover layers to provide additional rigidity.

3 Claims, 1 Drawing Sheet

ELECTRICALLY INSULATING THERMALLY CONDUCTIVE PAD FOR MOUNTING ELECTRONIC COMPONENTS

This application is a continuation of application Ser. No. 906,954, filed Sept. 15, 1986, now abandoned.

BACKGROUND AND SUMMARY OF THE INVENTION

This invention relates to a pad which fits between electronic components and the frame they are mounted on, and in particular to such a pad which is electrically insulating and thermally conductive.

Electronic components, such as integrated circuit chips, are becoming more dense and as a result generate considerable heat. Thus, these components must be mounted on a support frame or a heat sink which dissipates the heat and prevents them from exceeding their operating temperature. Since the frame of an electronic device typically is at ground potential, however, it is necessary to electrically isolate the component from the frame in order to prevent current from flowing between them thereby altering the circuitry in the component. While interface pads which serve this purpose are known in the prior art, materials which have high dielectric strength generally have low thermal conductivity. Accordingly, the prior art pads of this type generally do not have a high enough thermal conductivity to dissipate the heat generated by modern components across the distances necessary to create the required dielectric strength.

While diamonds are known to possess high dielectric strength and high thermal conductivity, a method has not been found to create sufficient area of contact between diamonds, which typically are octahedrons, and the elements they interconnect, and support the diamonds rigidly in this configuration without reducing the overall dielectric strength of the resulting pads or incurring considerable costs.

Collard, U.S. Pat. No. 3,678,995, provides an electronic component mounting pad having good heat transfer characteristics by embedding diamonds in a metallic substrate with the surface of the diamond being flush with the surface of the substrate. A thin film of metal is then deposited on top of the common diamond/substrate surface. The pad of Collard has very low dielectric strength, however, and as a result does not serve the same purpose as the pad of the present invention.

Seal, U.S. Pat. No. 3,721,289 overcomes the problem of creating sufficient surface area by sawing the diamonds into blocks having their opposed faces parallel. Sawing the diamonds is an expensive process, however, and heat sinks generated in this manner have an adverse effect on the overall cost of the electronic device.

Custers, et al., U.S. Pat. No. 3,828,848, combines the teachings of Collard and Seal by embedding diamonds in the substrate of a pad and then sawing the top off of the diamonds to create a side which is parallel with the side of the substrate. While somewhat less expensive than Seal, pads constructed according to the teachings of Custers, et al. are nonetheless very expensive to produce.

The present invention overcomes the shortcomings and limitations of the prior art pads of this type by dispersing diamond powder through a thin film of high dielectric strength material, such as "KAPTON." In a first embodiment of the invention the diamonds do not have to be of uniform size, however, the maximum dimension of the diamond pieces must be less than the thickness of the film. The diamonds must occupy at least 25% of the volume of the pad and preferably occupy up to 60% of its volume.

In a second embodiment of the invention, the diamonds fall within a narrow size range and all have a minimum dimension which slightly exceeds the thickness of the film in which they will be dispersed.

In both embodiments the diamonds are mixed with the high dielectric strength material while it is in a fluid state. The material then is formed into a film and cured with the diamond powder in it. Once the film has cured a thin boundary layer of copper or other metal may be bonded to it, by means such as electroless dipping or vacuum deposition. A thicker cover can then be electroplated onto the boundary layer and a substrate clad to the cover on at least one side of the pad. The resulting pad is joined to the electronic component and the frame by solder or adhesive.

Accordingly, it is a principal object of the present invention to provide a pad for placement between an electronic component and its support frame which has high thermal conductivity and high dielectric strength.

It is a further object of the present invention to provide such a pad which is comprised of a thin film of high dielectric strength material which has diamond powder dispersed through it.

It is a further object of the present invention to provide a filler material which can be dispersed through a high dielectric strength film to increase its heat transfer characteristics.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
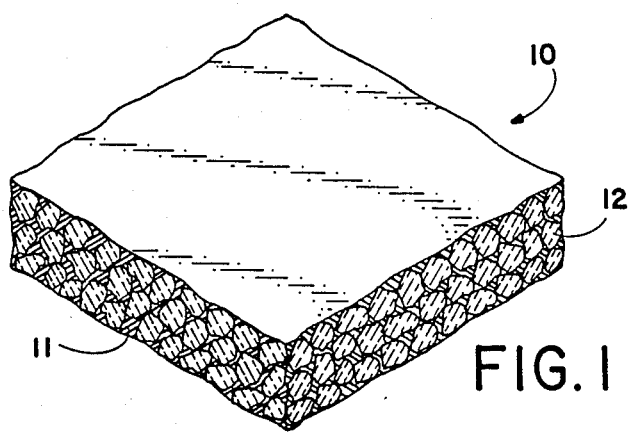
FIG. 1 is a fragmentary perspective view of the film used in the pad of the present invention.

Referring to FIG. 1 of the drawings, the pad 10 of the present invention comprises a thin film 11 of high dielectric strength material. The exact material depends on the particular application the pad will be utilized for, however, it must have high enough dielectric strength that a ½ to 5 mil sheet of it will not transmit current at the highest voltage reached in the electronic component which will be mounted on it. The higher the dielectric strength of the film the thinner it can be, and the thinner the material is the better it will transfer heat away from the component. Accordingly, it normally is preferable to use the highest dielectric strength material available which will work in this application. A material which works well for this purpose is "KAPTON" polyimide produced by DuPont. However, other materials having different properties may be preferred in some applications.

Figure 2:
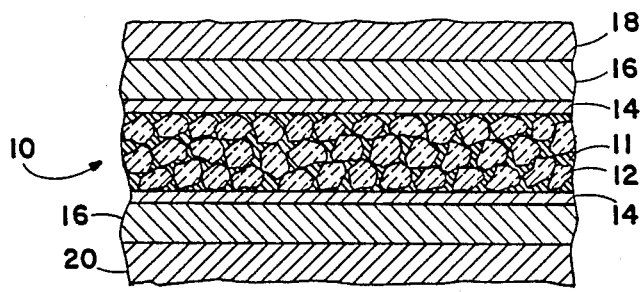
FIG. 2 is a fragmentary side elevation view, in cross section, of the pad of the present invention.

In order to increase the coefficient of thermal conductivity of the pad, since materials having high dielectric strength normally have low thermal conductivity, a filler of fragmentary diamond pieces 12, which are in the nature of a dust or powder, is embedded into it. Artificial or natural diamond will work equally well in this application. In the embodiment of the invention shown in FIGS. 1 and 2 the maximum dimension of the diamond pieces must be less than the thickness of the film. Diamond powder is a by-product of diamond mining and processing and is available in graduated sizes at a far lower cost than cubic diamond.

Addition of diamond filler up to a threshold of about 25% by volume does little to increase the thermal conductivity of the film. However, at a level of between 25%-60% by volume the filler dramatically increases the film's thermal conductivity, achieving a thermal conductivity of 4 watts/square meter/degree kelvin at the 60% level. Filler levels above 60% by volume can only be achieved if the filler contains different sizes of diamond pieces and even then it is hard to mix uniformly with the film material and there likely will be pockets of diamond powder in the film.

With materials such as "KAPTON," which are fluid until cured, the filler can be mechanically mixed by conventional techniques. With other materials which are more viscous, or never are in a fluid state, the filler will have to be forcibly dispersed throughout the material.

In applications where the pad must be rigid a 5,000-10,000 angstrom thick boundary layer 14 of copper or other metal is formed on both of its faces by means such as vacuum deposition or electroless dipping. The boundary layers 14 then are increased by electroplating a 1-3 mil metal cover 16 on top of them. Finally, the film can be clad onto a metallic substrate 18 to give additional rigidity.

The pad can be made in sheets or rolls, depending on the process by which the film is produced. It then is cut to match the particular electronic components to which it will be bonded. The completed pad is bonded to an electronic component 18 on one of its sides and to a support frame 20 on its other side by means of solder or an appropriate adhesive.

Figures 3, 4:
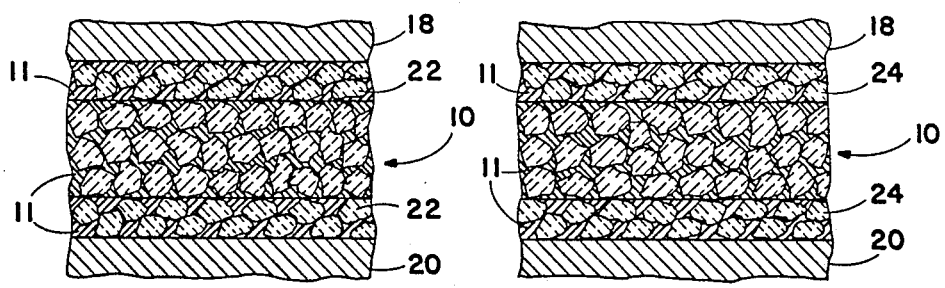
FIG. 3 is a fragmentary side elevation view, in cross section, of another embodiment of the pad of the present invention.
FIG. 4 is a fragmentary side elevation view, in cross section, of another embodiment of the pad of the present invention.

Alternately, the pad can be bonded by placing a sheet of silicone rubber 22, having the same diamond powder filler dispersed through it, between the film 11 and the electronic component 18 and/or the frame 20 (FIG. 3). This configuration is used where the elements are releasably held together under pressure rather than being bonded permanently by solder or adhesive. The compressed silicone sheet conforms to the mating surfaces so that there is little thermal contact resistance between them and the diamond filler increases the thermal conductivity of the silicone sheet to a high enough level for this purpose. Another bonding method is to use layers of "TEFLON" film 24, having the diamond filler material dispersed through them, to thermally join the pad 10 to the electronic component 18 and/or the frame 20 (FIG. 4). The use of silicone and "TEFLON" for bonds of this type are known in the prior art, but it is only through the use of the filler of the present invention that high levels of thermal conductivity can be achieved through bonding material of this type.

Figure 5:
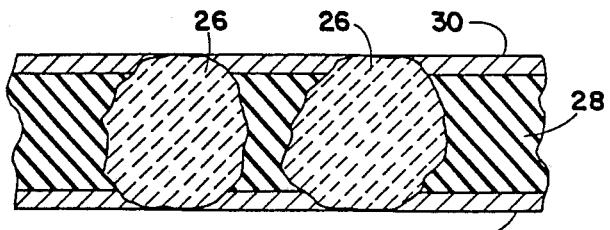
FIG. 5 is a fragmentary side elevation view, in cross section, of still another embodiment of the pad of the present invention.

In another embodiment of the invention, shown in FIG. 5, the minimum dimensions of the diamond pieces 26 must be the same or slightly greater than the thickness of the film 28. Thus, direct diamond heat transfer paths are formed at spaced intervals in the film. In this embodiment, after the film has been formed with the diamond pieces in it a thin layer of the film is removed by means such as chemical etching. Thus, the tips of the diamond pieces protrude from the film. When the copper boundary layer 30 is formed on the top and bottom surfaces of the film the exposed tops of the diamond pieces extend into them. Thus, pure diamond heat transfer paths extend across the film. As a result, high thermal conductivity can be obtained with a far lower percentage of diamond filler than is required in the first embodiment of the invention, and overall higher values of thermal conductivity can be obtained. In addition, unlike the first embodiment of the invention, there is no threshold amount of filler required to achieve increased thermal conductivity. Since there are direct heat transfer paths through individual diamond pieces the thermal conductivity is linearly related to the density of the diamond pieces. However, unlike the prior embodiment, the diamond pieces must have a uniform size relative to the desired film thickness which requires using graded diamond powder.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A pad for thermally joining and electrically insulating a heat-generating electronic component and a heat sink, said pad comprising:
   a thin film of high dielectric strength material having top and bottom major surfaces;
   a plurality of substantially uniform size diamond pieces imbedded in said film, each of said diamond pieces having a first portion protruding through said top surface of said film and a second portion protruding through said bottom surface of said film; and
   a first thin layer of a high thermal conductivity material bonded to said top surface of said film and a second thin layer of a high thermal conductivity material bonded to said bottom surface of said film, said first thin layer and said second thin layer contacting said first and second portions of said diamond pieces protruding through said film surfaces, said first and second thin layers ensuring a direct heat transfer path between said electronic component and said heat sink.

2. The pad of claim 1 wherein said first and second thin layers of a high thermal conductivity material are thin layers of metal.

3. The pad of claim 2 wherein said metal is copper.

* * * * *